United States Patent [19]
Gannage

[11] Patent Number: 5,889,721
[45] Date of Patent: Mar. 30, 1999

[54] METHOD AND APPARATUS FOR OPERATING FUNCTIONS RELATING TO MEMORY AND/OR APPLICATIONS THAT EMPLOY MEMORY IN ACCORDANCE WITH AVAILABLE POWER

[75] Inventor: Michel Gannage, Santa Clara, Calif.

[73] Assignee: Integrated Silicon Solution, Inc., Santa Clara, Calif.

[21] Appl. No.: 915,955

[22] Filed: Aug. 21, 1997

[51] Int. Cl.$^6$ ............................................. G11C 7/00
[52] U.S. Cl. ..................... 365/226; 365/227; 365/228; 365/189.01; 365/189.07
[58] Field of Search ............................... 365/226, 227, 365/228, 189.07, 189.09, 189.01

[56] References Cited

U.S. PATENT DOCUMENTS

| | | | |
|---|---|---|---|
| 5,144,585 | 9/1992 | Min et al. | 365/266 |
| 5,301,161 | 4/1994 | Landgraf et al. | 365/226 |
| 5,331,599 | 7/1994 | Yero | 365/266 |
| 5,363,335 | 11/1994 | Jungroth et al. | 365/266 |
| 5,412,602 | 5/1995 | Yero | 365/226 |
| 5,418,747 | 5/1995 | Tobita | 365/226 |
| 5,444,412 | 8/1995 | Kowalski | 365/226 |
| 5,444,663 | 8/1995 | Furuno et al. | 365/266 |
| 5,519,656 | 5/1996 | Maccarrone et al. | 365/226 |
| 5,523,978 | 6/1996 | Yoon et al. | 365/226 |
| 5,537,065 | 7/1996 | Torgerson | 365/226 |
| 5,574,697 | 11/1996 | Manning | 365/226 |
| 5,659,503 | 8/1997 | Sudo et al. | 365/189.07 |
| 5,659,516 | 8/1997 | Casagrande et al. | 365/226 |
| 5,712,825 | 1/1998 | Hadderman et al. | 365/226 |

*Primary Examiner*—David Nelms
*Assistant Examiner*—Tuan T. Nguyen
*Attorney, Agent, or Firm*—David H. Carroll

[57] ABSTRACT

A programmable memory device includes circuits that permit the selective disabling of certain functions when a battery supply voltage falls below the point necessary to sustain those functions while not disabling other functions of the device capable of working at the lower supply voltage. The programmable memory device includes a controller (422), programmable memory (426), and a voltage monitor (424), and is used in an application having additional circuitry (430). Power is furnished between the main voltage $V_{CC}$ terminal and the ground GND terminal from an external power source, typically a set of batteries. The voltage monitor enables full extension of the operational voltage range for specific functions of the programmable memory device, or for the application circuitry, or for both by reliably detecting the voltage level of the power source and providing an indication thereof. The indication of the present voltage level is used for suppressing functions that cannot be sustained at the present voltage level.

53 Claims, 6 Drawing Sheets

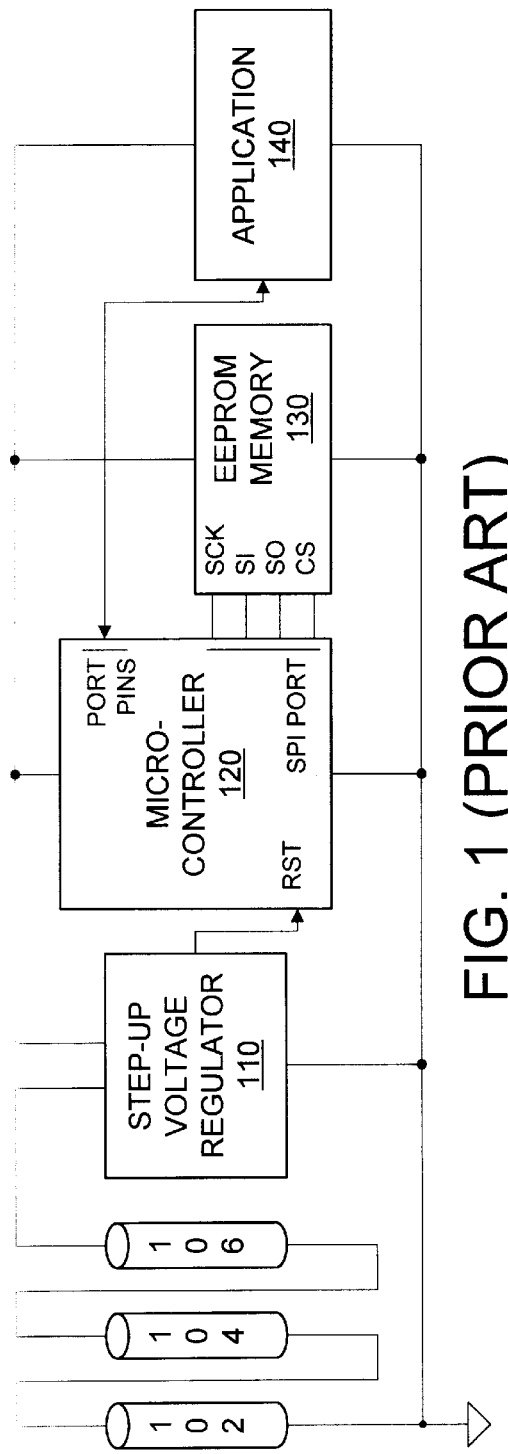
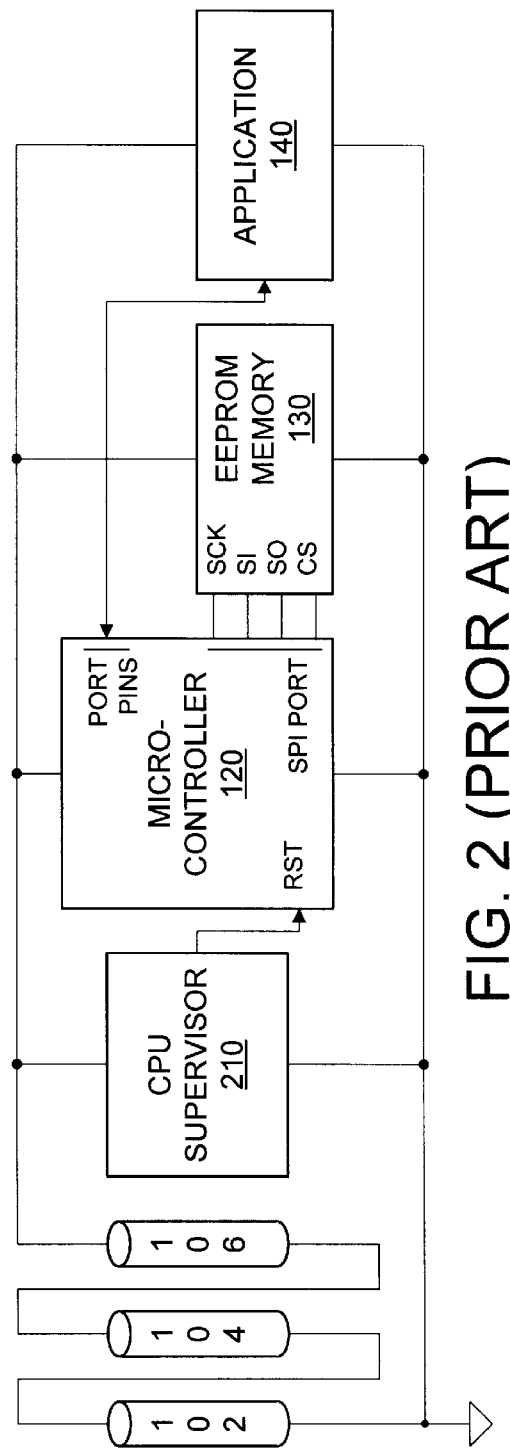

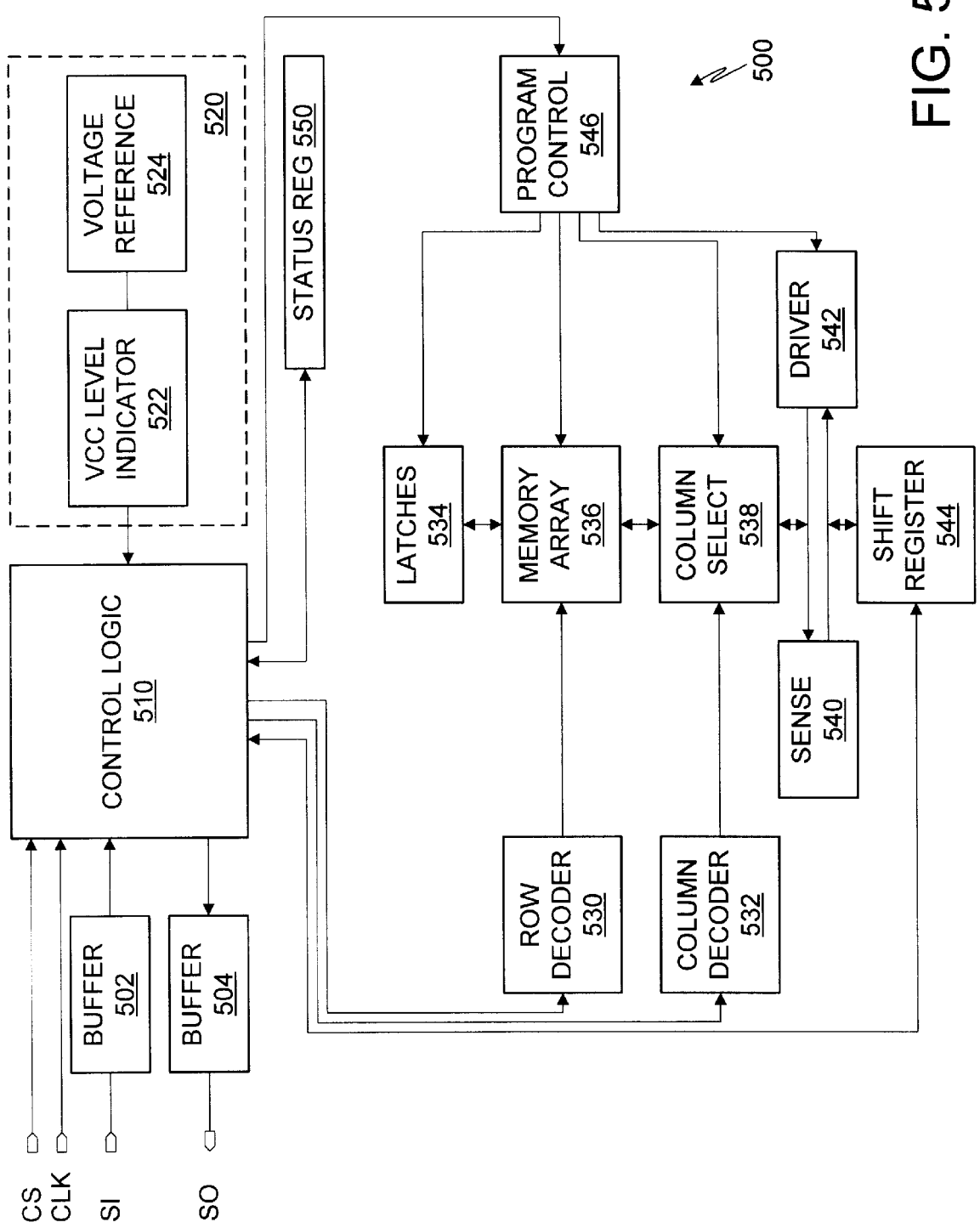

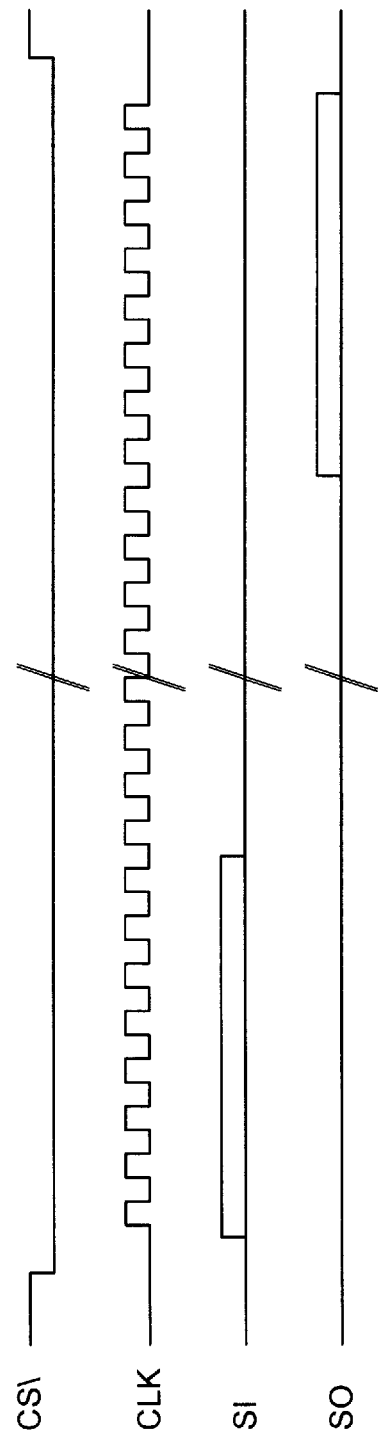

METHOD AND APPARATUS FOR OPERATING FUNCTIONS RELATING TO MEMORY AND/OR APPLICATIONS THAT EMPLOY MEMORY IN ACCORDANCE WITH AVAILABLE POWER

BACKGROUND OF THE INVENTION

1. Field of the Invention

The present invention relates to memory and applications that use memory, and more particularly to operating applications that use memory and memory having different operating modes with different power requirements, in accordance with available power.

2. Description of Related Art

Traditional channel hot electron ("CHE") Flash memory is used in many applications, but is not entirely suitable for use in portable battery operated applications because of its high active current consumption—on the order of 50 mA—and because of its need for two power supplies, $V_{CC}$ and $V_{PP}$. However, programmable non-volatile memories requiring only a single power supply and having low power consumption, low voltage, and high density characteristics have become available, and have enabled or facilitated a variety of battery-operated applications. For example, the type NX25F080 memory available from Nexcom Technology, Inc. of Sunnyvale, Calif., is an 8 Mbit Serial Flash memory which has an SPI interface and draws only 5 mA of current at a $V_{CC}$ supply of 3.0 volts. The NX25F080 Serial Flash memory is tailored for battery operated microcontroller-based applications that use small form factor memory to store and/or transfer data, audio and images in a portable or mobile environment. Applications include digital cameras, portable scanners, voice/data recorders and pagers, cellular phones, hand held terminals, and portable data acquisition equipment.

In certain markets such as the consumer electronic market, the user application is extremely cost sensitive. Unfortunately, many battery operated consumer electronic products must include a costly voltage regulator to handle the problem of battery output voltage drop as the battery discharges. For example, an AA or AAA alkaline battery starts fresh with a 1.5 V output voltage and discharges with use until reaching its "end of life" voltage of 0.9 V. Where an electrical device is able to tolerate only a narrow range of voltages, from a low voltage that is high enough to operate the device properly to a high voltage that is low enough not to damage the device, a range typically of about ten percent (i.e., 5 V±10% or 3.3 V±10%), the system designer typically provides an on-board voltage regulator such as the step-up voltage regulator 110 shown in FIG. 1. FIG. 1 shows three batteries 102, 104 and 106, which provide the power input to the voltage regulator 110. The output of the voltage regulator 110 is furnished, for example, to a microcontroller 120, memory 130, and an application 140. If the output of the voltage regulator 110 drops below the low voltage specification, a reset output pin is asserted to notify the microcontroller 120 of a power failure. Unfortunately, this approach adds one or more components to the product, thereby increasing cost and shortening battery life.

Alternatively, a system designer may use components in the device having wider operational voltage ranges. For example, if all the components in a device have an operational range of from 2.7 V (3×0.9 V) to 4.5 V (3×1.5 V), then three AAA batteries can be used to power the product without the need for an on-board voltage regulator. In this case, more than 90% of the capacity of the batteries can be utilized. However when the supply voltage drops below 2.7 V, the system needs to be notified about the end of life of the batteries. For this, a CPU supervisor typically is utilized. CPU supervisors are available from numerous vendors, including Dallas Semiconductor of Dallas, Tex., which offers a family of such chips under the product numbers DS123x. FIG. 2 shows a CPU supervisor 210 installed in a system. If $V_{CC}$ drops below a certain voltage (in the case of the DS123x products, 4.5 V for 5 V systems and 2.7 V for 3.0 V systems), then a Reset output pin is asserted to notify the microcontroller 120 about a power failure so that the microcontroller 120 can act accordingly. Unfortunately, this approach retains a disadvantage of the previous method, which is the need for an additional chip which increases the cost of the product.

In order to address the cost issue associated with adding chips to a memory product to improve its operational voltage range, some memory integrated circuits combine a CPU supervisor with memory, as shown by the memory 330 in FIG. 3. For example, a single chip solution containing 4K bits of EEPROM memory as well as a CPU supervisor and a reset controller circuit is available as product number X25045 from Xicor Semiconductor, Inc. of San Jose, Calif. This chip monitors the system supply voltage level and generates a reset when the voltage declines below a certain value. In the 5 V part (X25043) a reset is asserted when the supply voltage falls below 4.5 V, while in the 3 V part (X25043-2.7) a reset is asserted when the supply voltage falls below 2.7 V.

Although the use of a CPU supervisor in combination with memory achieves a greater operational voltage range without significant additional cost, further improvement would be desirable.

BRIEF SUMMARY OF THE INVENTION

Applications that use memories may perform functions that have different voltage requirements. For example, where the application includes a programmable non-volatile memory, the voltage requirements for programming (erasing followed by writing) tend to be higher than for reading. Advantageously, the present invention allows the operational voltage range for the programmable non-volatile type of memory to be extended by monitoring the level of the supply voltage so that certain functions of the programmable non-volatile memory may be selectively suppressed when the supply voltage falls below the point necessary to sustain those functions while other functions of the memory capable of working at the lower supply voltage are not suppressed. Alternatively, functions of the application other than memory functions may be selectively suppressed as the supply voltage falls below the point necessary to sustain those functions. Advantageously, the present invention provides a low component count solution for the memory and for any application that is based on the memory by integrating a voltage monitor with the memory. For example, the enhanced operational range programmable non-volatile memory may be implemented on a single chip without compromising the memory capacity.

One embodiment of the present invention is a method of operating a memory in an application. The method includes furnishing power to an integrated circuit containing the memory, the power having a variable voltage level; establishing different first and second voltage threshold specifications for first and second functions of the application respectively; generating on the integrated circuit an indication of the voltage level; determining from the indication whether the voltage level is less than the first voltage threshold and whether the voltage level is less than the second voltage threshold; suppressing the first function of the application in response to the determining step when the voltage level is less than the first voltage threshold; and suppressing the second function of the application in response to the determining step when the voltage level is less than the second voltage threshold.

Another embodiment of the present invention is a method of operating a memory. The method includes applying power to an integrated circuit containing the memory, the power having an applied voltage component with a variable level; generating on the integrated circuit an indication of the level of the applied voltage, the indication being one of a plurality of different level indications; and communicating control and data signals for the memory and the voltage level indication through a common interface on the integrated circuit.

Yet another embodiment of the present invention is a method of operating a memory having first and second operating modes operable above respective first and second voltage thresholds. The method includes applying power to an integrated circuit containing the memory, the power having an applied voltage component with a variable level; generating on the integrated circuit an indication of the level of the applied voltage, the indication being one of a plurality of different level indications; suppressing the first operating mode in response to the indication if the level of the applied voltage is less than the first voltage threshold; and suppressing the second operating mode in response to the indication if the level of the applied voltage is less than the second voltage threshold.

A further embodiment of the present invention is a method of operating an electronic system having a programmable non-volatile memory integrated circuit and an application that utilizes the memory. The method includes furnishing power to the electronic system, the power having a variable voltage level; operating the system; querying the integrated circuit for an indication of the voltage level at a particular moment in time during the system operation step; and generating on the integrated circuit an indication in response to the querying step of the voltage level at the particular moment in time during the system operation step.

Another embodiment of the invention is a memory integrated circuit comprising a power bus, a programmable non-volatile memory array having a read mode and a write mode, a controller, and a voltage level monitor. The controller has a voltage level input and also has inputs/outputs coupled to the programmable non-volatile memory array for accessing the programmable non-volatile memory in the read mode and the write mode. The voltage level monitor is coupled to the power bus and has a voltage level output coupled to the voltage level input of the controller. The voltage level output tracks the voltage level on the power bus.

Another embodiment of the invention, a memory-based application, comprises a power bus; a programmable non-volatile memory array having a read mode and a write mode; a first controller which may be, for example, a simple hardwire control logic integrated with the programmable non-volatile memory on an integrated circuit; a voltage level monitor integrated with the programmable non-volatile memory on the integrated circuit; a second controller which may be, for example, a microcontroller coupled to the first controller; and an application circuit which may be, for example, a voice recorder coupled to the power bus and to the second controller. The first controller has a voltage level input and also has inputs/outputs coupled to the programmable non-volatile memory array for selectively accessing the programmable non-volatile memory in the read mode and the write mode. The voltage level monitor is coupled to the power bus and has a voltage level output that tracks voltage level on the power bus, the voltage level output being coupled to the voltage level input of the controller. In one variation, the first controller is coupled to the second controller through a serial interface. Suitable serial protocols include the NXS, SPI, I$^2$C, and $\mu$ Wire protocols.

A further embodiment of the present invention is a memory integrated circuit comprising a power bus; a programmable non-volatile memory array; a controller having a first, second and third ports, the first port being coupled to the programmable non-volatile memory array for accessing the programmable non-volatile memory; and a voltage level monitor coupled to the power bus and having a voltage level output coupled to the second port of the controller. The voltage level output tracks voltage level on the power bus. The third port of the controller is an interface port for receiving voltage level indication query commands and for reporting respective indications of voltage levels on the power bus. Suitable controllers include hardwired and programmable array logic circuits, as well as software programmed general purpose controllers. Suitable voltage level indications include encoded voltage values, and binary values indicating whether voltage levels on the power bus have dropped below a predetermined value. The interface port may be parallel or serial. Suitable serial protocols include the NXS, SPI, I$^2$C, and $\mu$ Wire protocols.

BRIEF DESCRIPTION OF THE SEVERAL VIEWS OF THE DRAWING

In the drawings, in which like reference characters indicate like parts:

FIG. 1 is a block schematic diagram of a prior art system having an EEPROM memory device combined with a step up voltage regulator;

FIG. 2 is a block schematic diagram of a prior art system having an EEPROM memory device combined with a CPU supervisor;

FIG. 5 is a block schematic diagram of a programmable serial non-volatile memory device having an integrated voltage monitor in accordance with one aspect of the present invention to maintain operation of various functions over their respective operational voltage ranges as battery power declines;

FIG. 6 is a pictorial diagram showing various data fields of an input data stream;

FIG. 7 is a graph showing a family of signals used for operating a programmable serial non-volatile memory device having a voltage monitoring capability in accordance with one aspect of the present invention.

DETAILED DESCRIPTION OF THE INVENTION

Programmable memory devices, including removable small form factor programmable memory devices such as those disclosed in U.S. patent application Ser. No. 08/689,687, filed Aug. 13, 1996 in the name of inventors Robin J. Jigour and David K. Wong and entitled "Digital Media," and in U.S. patent application Ser. No. 08/823,937 (Attorney Docket No. A1032P1US), filed Mar. 25, 1997 in the name of inventors Robin J. Jigour and David K. Wong and entitled "Digital Media," which hereby are incorporated herein in their entirety by reference thereto, are suitable for information storage in a variety of battery-powered applications, including, for example, digital cameras, solid-state voice recorders, portable scanners and bar-code readers, voice/data pagers, cellular phone answering machines, portable pen-based tablets, hand-held terminals and meters, and portable data acquisition equipment. Examples of media elements stored or transferred include voice and sound clips, facsimile, pictures, writing, drawing, scanned images, maps, e-mail, data logging, downloadable code, and general data files. Maintaining certain memory functions even as the battery power declines is advantageous in many of these applications.

Figure 3:
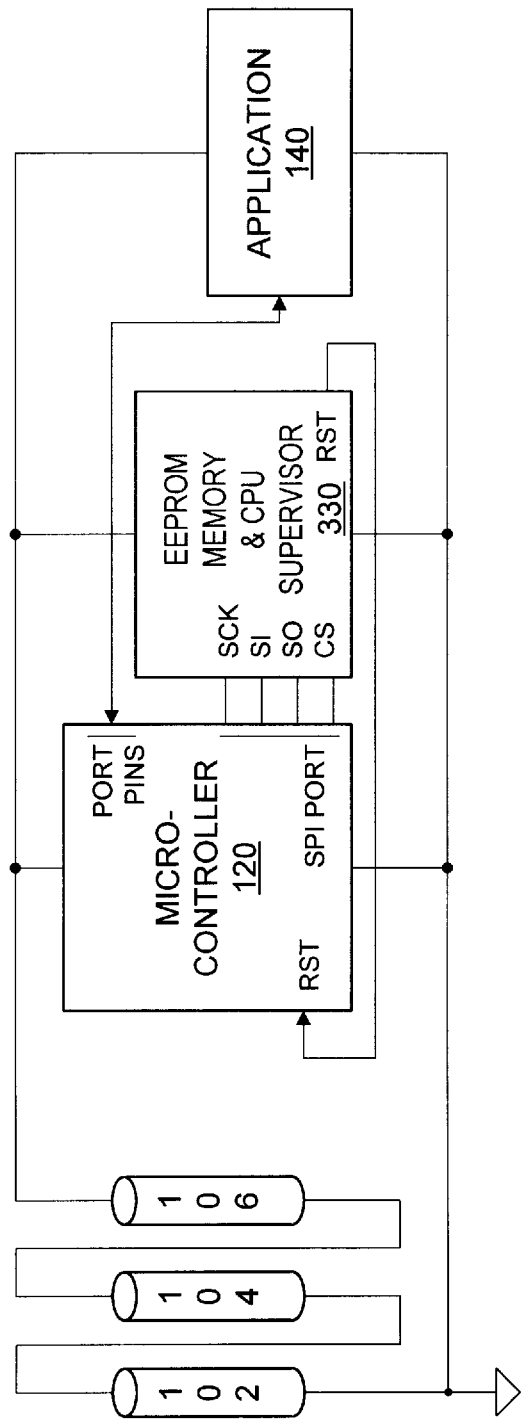
FIG. 3 is a block schematic diagram of a prior art system using an EEPROM memory device combined with a CPU supervisor on a single chip.
Figure 4:
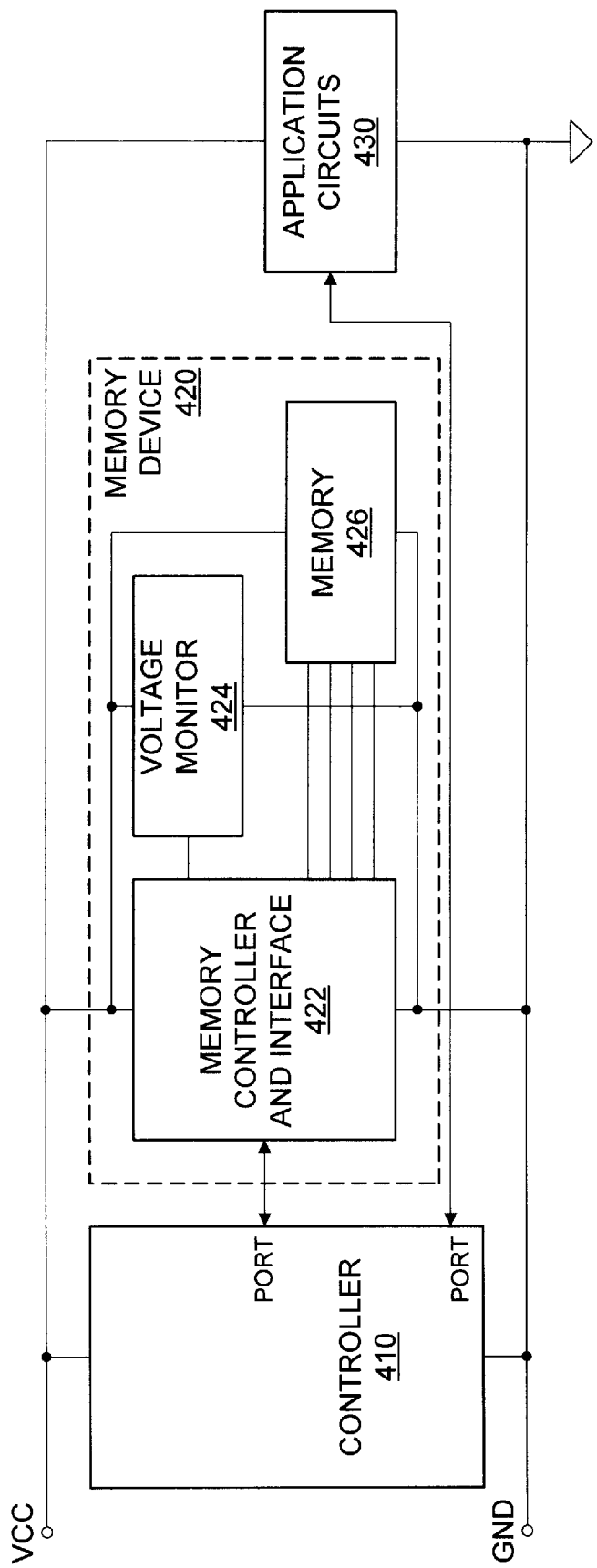
FIG. 4 is a block schematic diagram of a system that includes a programmable non-volatile memory device having an integrated voltage monitor in accordance with one aspect of the present invention for maintaining operation of various functions over their respective operational voltage ranges as battery power declines.

FIG. 4 shows a system that selectively suppresses certain functions when the battery supply voltage falls below the point necessary to sustain those functions without affecting the performance of other functions capable of working at the lower supply voltage. Illustratively, the application 430 in FIG. 4 is, for example, a new generation pager of the type that stores data and voice messages as well as phone numbers in programmable memory 426, and displays or plays back the information under user control. Alternatively, the application 430 may be any of the previously mentioned battery powered applications, or even new battery powered applications. Receiving new messages involves programming the programmable memory 426, which is a power intensive operation that cannot be performed at low supply voltage. However, displaying and playing back audio and visual information involves a read of the programmable memory 426, which can be performed at low supply voltage.

The system of FIG. 4 includes a controller 410, a memory device 420 having a memory controller and interface 422, a voltage monitor 424, and a programmable non-volatile memory 426, and the application 430. Power is furnished to a main voltage $V_{CC}$ terminal and a ground GND terminal from an external power source, typically a battery or set of batteries. Memory 426 is any programmable non-volatile memory having any desired architecture and any type of programmable memory cell, but preferably an electrically erasable programmable memory of which EEPROM and Flash memory are illustrative. Especially preferred is high density serial flash memory, which requires few power and signal lines and features low voltage operation, low power consumption, and high capacity non-volatile data storage. A suitable serial flash memory is available from Nexcom Technology, Inc., as previously mentioned, and is described in the aforementioned applications of Jigour et al. Preferably, the memory controller and interface 422, the voltage monitor 424, and the memory 426 are implemented on a single integrated circuit chip. Controller 410 and the controller portion of the memory controller and interface 422 are any suitable type of controller, including hardwired logic, programmable logic, and general purpose microcontrollers and microprocessors under control of programs stored in ROM or RAM. For simple applications such as paging, controller 410 preferably is a simple microcontroller such as type 8051, type PIC, or type 68HC05, which are commonly available from a variety of manufacturers. Where the application 430 is complex or where advanced error correction and other processor-intensive algorithms are required, a complex logic circuit, microcontroller or microprocessor may be needed for the controller 410. Preferably, the memory controller and interface 422 is a logic circuit. Any suitable connections may be used between the memory controller and interface 422 and a port of the controller 410, including parallel and serial inputs and outputs with or without chip enable and read/write lines. The controller 410 and the controller portion of the memory controller and interface 422 may, if desired, be combined into a single controller located external to the memory device 420, internal to the memory device 420, or integrated on the same integrated circuit as the voltage monitor 424 and the memory 426.

The voltage monitor 424 provides indications useful for extending the operational voltage range of the system of FIG. 4. The voltage monitor 424 reliably provides an indication of the present voltage level of the power source, thereby "tracking" the voltage level over time, and the indication of the present voltage level is used by the controller 410 for suppressing functions that cannot be sustained at the present voltage level. These functions include memory function, application functions (audio reproduction, visual display, sensor operation, transducer operation, and so forth, depending on the application), other system functions (not shown), or a combination thereof. Preferably, each measurement of present voltage level is obtained under maximum load.

Following is an example of how the voltage monitor 424 is used to extend the operation voltage range of the system of FIG. 4 in view of the characteristics of the memory 426. Programmable memories tend to perform functions having different voltage requirements. Some types of serial Flash memory have a minimum $V_{CC}$ for programming (erasing followed by writing) of 2.7 V, a minimum $V_{CC}$ for reading the memory array of 2.4 V, and a minimum $V_{CC}$ for reading a status register of 1.8 V. Illustratively, the first memory function to be suppressed would be memory programming when the voltage available from the power source falls below 2.7 V. However, data stored in the programmable memory 422 and the contents of any status register (not shown) associated with the controller 410 would remain accessible for reading. Read-only access is quite useful in certain applications such as, for example, paging systems that receive and store short messages. Even though the pager's battery would be too drained to power the storage in memory of new messages, old messages would not be lost and could still be read. This would not be possible in the prior art approaches that shut down the entire programmable memory device when available power dips below a particular level determined by the inoperative voltage threshold of the least tolerant component or function of the application. Illustratively, the next function to be suppressed would be reading of the memory array when the voltage available from the power source falls below 2.4 V. However, the contents of any status register associated with the controller 410 would remain accessible for reading until the voltage available from the power source falls below 1.8 V.

It will be appreciated that to keep the memory device 420 as simple as possible, it is advantageous for the controller 410 to handle the suppression of functions whose operating voltage requirements are greater than the available voltage. However, if desired the suppression process may be handled by the memory controller and interface 422.

The voltage monitor 424 produces any suitable type of indication. For example, one suitable type of indication is a byte, nibble, or other length of bits that encodes the value of the level of the supply voltage. Another suitable type of indication is a logical 1 or 0 generated in response to a query request to indicate whether the supply voltage has dropped below a particular level stated in the query request. Yet another suitable type of indication is a set of bits that indicate by their value whether the supply voltage has dropped below particular levels respectively represented by the bits.

Where the indication is furnished to control circuitry in the application, it is carried on any suitable one or group of the lines connecting the programmable memory device to the application. Suitable lines include data lines and the $V_{CC}$ line.

FIG. 5 shows a serial programmable non-volatile memory device 500 which is implemented on a single integrated circuit. The memory device 500 is suitable for a variety of uses, including digital media as disclosed in the aforementioned Jigour et al. patent applications and the solid state disk drive device, or "SSD" device, disclosed in U.S. Pat. No. 5,291,584, issued Mar. 1, 1994 to Nagesh Challa and Michael E. Gannage and entitled "Method and Apparatus for Hard Disk Emulation." The memory device 500 includes a voltage monitor circuit 520 which facilitates the suppression of certain functions while other functions requiring less voltage than is available from the power supply are not affected. External communication and internal memory functions are handled by control logic 510, which for the digital media application is a simple logic circuit. Although separate serial data inputs and data outputs are shown for the memory device 500, a single serial data I/O may be used if desired or a parallel I/O may be used if desired, with data being read or written in parallel using nibbles, words, doublewords or any other desired data path width. Status register 550 stores memory status information and is accessible by the control logic 510.

The memory device 500 also includes a programmable, non-volatile memory array 536, which is addressed by a row address decoder 530 and a column select circuit 538 in conjunction with a column address decoder 532. A particularly compact programmable memory cell design and a memory array based on this cell design and which uses various voltages to control erasing, programming, and reading is described in U.S. Pat. No. 5,297,081, issued Mar. 22, 1994 to Nagesh Challa, which is hereby incorporated herein by reference in its entirety. During a memory read operation, sense amplifiers 540 receive data from addressed locations of the memory array 536 and furnish the data to a shift register 544, which in turn furnishes the data on serial output line SO under control of the control logic 510 to, for example, an external controller (not shown). During a programming operation, data is received from, for example, an external controller (not shown) on serial input line SI and furnished to the shift register 544 while drivers 542 write the data from the shift register 544 into latches 534 for programming the memory array 536. A high voltage supply that includes charge pumps (not shown) and oscillators (not shown) is used to program the memory array with the values stored in the latches 534, under control of programming controller 546. Programming controller 546 also controls the operation of circuits in the memory array 536, the column select 538, and the drivers 542 to achieve programming of the memory array 536. Circuits in the programming controller 546 are timed by a write timer (not shown) and an erase timer (not shown). It will be appreciated that certain standard memory circuit elements well known to one of ordinary skill in the art, such as power buses, shift registers, voltage supplies, timers, and oscillators, are omitted from FIG. 5 for clarity.

Commands and data are furnished to the programmable memory device 500 on the serial data input line SI, and data is output from the programmable memory device 500 on the serial data output line SO. Various protocols may be used for communicating data and commands between the application and the programmable memory device 500. Preferred serial interface protocols are the Nexcom Serial Interface protocol, or NXS protocol, which specifies a two-wire interface, viz. Clock and Data I/O; and the Serial Peripheral Interface ("SPI") protocol, which specifies a four-wire interface, viz. Clock, Data In, Data Out, and Chip Select. The NXS and SPI protocols are described in more detail in the aforementioned Jigour et al. patent applications. The NXS and SPI protocols are illustrative, and other protocols, either serial or parallel, may be used if desired. Other suitable protocols include $I^2C$ and $\mu$ WIRE.

Illustratively for a solid state disk application, a suitable data stream is shown in FIG. 6 and includes an 8-bit opcode field, a 16-bit sector address field, a 16-bit column address field, and a 536-byte data field. The opcode is decoded by the control logic 510. The next bit field, the sector address, is stored in a row address shift register (not shown), and the next bit field, the column address, is stored in a column address shift register associated with the column address decoder 532. The next field is a 536 byte data field, which is transferred in 8 bit blocks when the opcode is a read or write command either to or from the 8-bit data shift register 544.

Monitoring of the power supply voltage may be initiated internally or externally to the programmable memory device. FIG. 7 shows a family of illustrative signals suitable for externally initiate power supply monitoring. A specific opcode is added to the SPI instruction set to query the supply voltage level. After the CS\ signal is asserted low, the supply voltage level opcode is presented on the data input line SI and is shifted in serially on the rising edge of the clock CLK. Illustratively, the opcode is eight bits, so after eight clock pulses the opcode byte is shifted into the control logic 510 and decoded internally to the memory chip. A stable reference voltage, illustratively a bandgap voltage reference circuit 524, is powered up as the programmable memory device 500 is put in its worst case power consumption mode by causing all of the internal voltage pumps to start pumping. The bandgap voltage reference 524 is permitted to stabilize before the supply voltage measurement is taken. Illustratively, a delay of a few microseconds is inserted before the supply voltage measurement is taken by any suitable technique such as, for example, by stopping the clocks for a suitable period, e.g. five microseconds, or by inserting dummy cycles for a suitable period, e.g. 50 clock pulses at 10 mhz. This delay allows the bandgap to stabilize and deliver a stable voltage across $V_{CC}$ and temperature. The reference voltage is delivered to a level indicator circuit 522, which uses the reference voltage to determine the supply voltage level. The measured supply voltage level is encoded in a four bit latch in the level indicator 522 and furnished to the control logic 510, which in turn reports the value as data on the data output line SO. Based on the supply voltage level value reported, the external memory controller determines whether to permit certain operations to occur.

Figure 8:
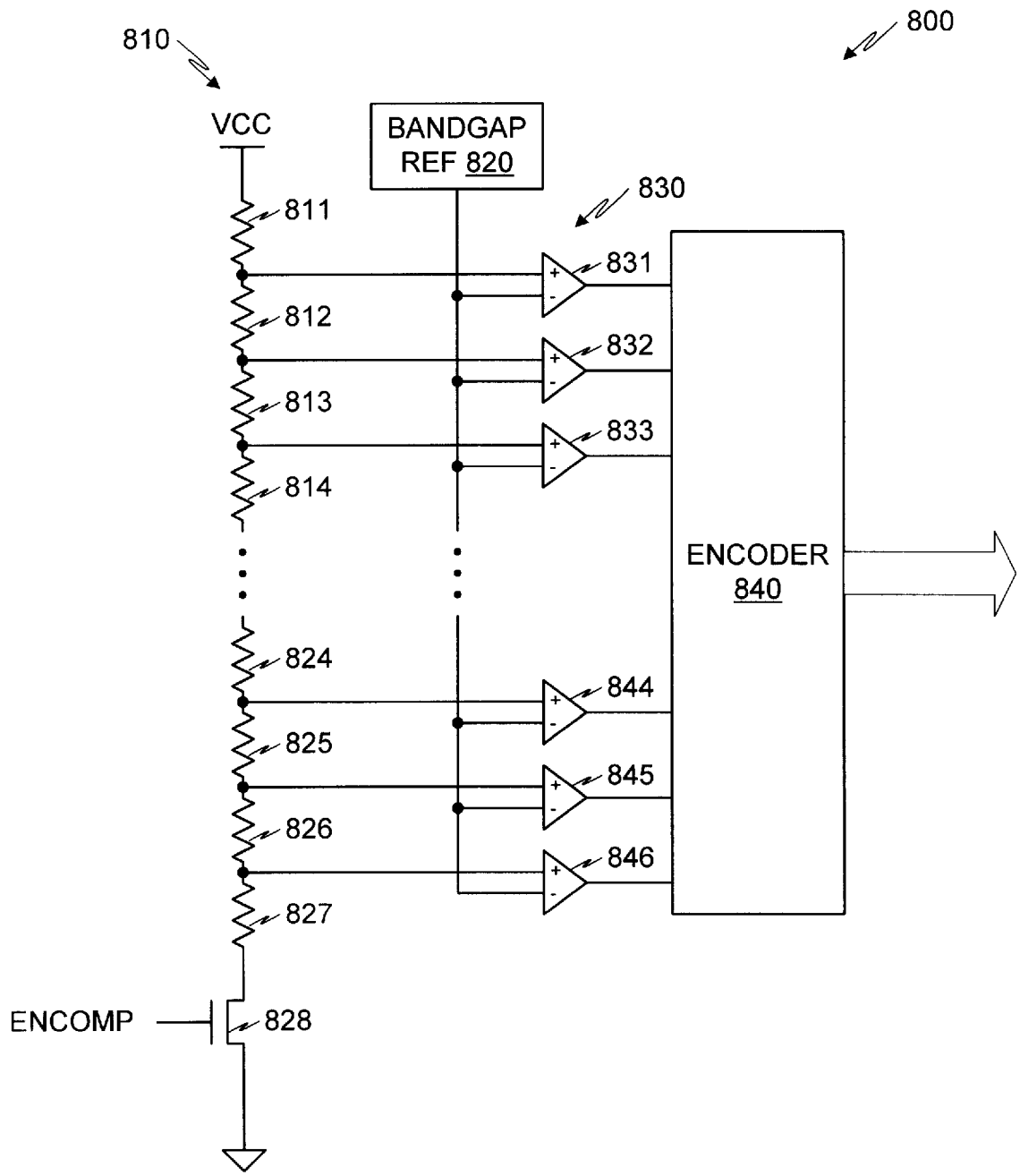
FIG. 8 is a mixed component-level and block-level schematic diagram of a 16-bit comparator in combination with other circuits, the combination being useful as a voltage monitor.

FIG. 8 shows a 16-bit comparator 800 that is suitable for use as the voltage level monitor circuit 520. After bandgap reference circuit 820 stabilizes, it delivers a steady voltage of, for example, 1.2 V. A resistor divider 810 between $V_{CC}$ and ground has seventeen resistors 811–827 (resistors 815–823 not shown) and sixteen outputs 831–846 (outputs 834–843 not shown) that range from 66.7% of $V_{CC}$ to 36.3% of $V_{CC}$. Transistor 828 controls whether the comparator 800 is enabled. Starting at 1.8 V with 0.1 V increments, an array 830 of sixteen comparators including comparators 831–833 and 844–846 receive the sixteen outputs of the resistor divider 810 and compares this divided $V_{CC}$ to the bandgap voltage of 1.2 V. For example if $V_{CC}$ is above 2.0 V but below 2.1 V, the first three comparators 831–833 return a "1" value and the other thirteen comparators return a "0" value. Illustrative values for the resistors in the resistor divider 810 and the logical values returned by the comparators are listed below in Table 1.

TABLE 1

| REF. NO. | VALUE | LOGICAL VALUE REPORTED | |
|---|---|---|---|
| | | 1 | 0 |
| 811 | 33.3K | $V_{CC}$ > 1.8 V | $V_{CC}$ < 1.8 V |
| 812 | 3.6K | $V_{CC}$ > 1.9 V | $V_{CC}$ < 1.9 V |
| 813 | 3.1K | $V_{CC}$ > 2.0 V | $V_{CC}$ < 2.0 V |
| 814 | 2.8K | $V_{CC}$ > 2.1 V | $V_{CC}$ < 2.1 V |
| 815 | 2.6K | $V_{CC}$ > 2.2 V | $V_{CC}$ < 2.2 V |
| 816 | 2.4K | $V_{CC}$ > 2.3 V | $V_{CC}$ < 2.3 V |
| 817 | 2.2K | $V_{CC}$ > 2.4 V | $V_{CC}$ < 2.4 V |
| 818 | 2.0K | $V_{CC}$ > 2.5 V | $V_{CC}$ < 2.5 V |
| 819 | 1.8K | $V_{CC}$ > 2.6 V | $V_{CC}$ < 2.6 V |
| 820 | 1.7K | $V_{CC}$ > 2.7 V | $V_{CC}$ < 2.7 V |
| 821 | 1.6K | $V_{CC}$ > 2.8 V | $V_{CC}$ < 2.8 V |
| 822 | 1.5K | $V_{CC}$ > 2.9 V | $V_{CC}$ < 2.9 V |
| 823 | 1.4K | $V_{CC}$ > 3.0 V | $V_{CC}$ < 3.0 V |
| 824 | 1.3K | $V_{CC}$ > 3.1 V | $V_{CC}$ < 3.1 V |
| 825 | 1.2K | $V_{CC}$ > 3.2 V | $V_{CC}$ < 3.2 V |
| 826 | 1.1K | $V_{CC}$ > 3.3 V | $V_{CC}$ < 3.3 V |
| 827 | 36.3K | | |

The sixteen outputs of the comparators of the array 830 are furnished to an encoder 840 which outputs a 5-bit supply voltage status value. The supply voltage status value is then reported by the control logic 510 as an 8-bit quantity on the serial data output line SO after the instruction is decoded and the bandgap has settled. For example, if $V_{CC}$ is above 2.0 V but below 2.1 V, the status byte returned on the serial data output SO is 0000 0011. Illustrative supply voltage status values for various $V_{CC}$ supply levels are listed below in Table 2.

TABLE 2

| HIGH NIBBLE | LOW NIBBLE | VCC SUPPLY |
|---|---|---|
| 0000 | 0000 | <1.8 V |
| 0000 | 0001 | 1.8 V |
| 0000 | 0010 | 1.9 V |
| 0000 | 0011 | 2.0 V |
| 0000 | 0100 | 2.1 V |
| 0000 | 0101 | 2.2 V |
| 0000 | 0110 | 2.3 V |
| 0000 | 0111 | 2.4 V |
| 0000 | 1000 | 2.5 V |
| 0000 | 1001 | 2.6 V |
| 0000 | 1010 | 2.7 V |
| 0000 | 1011 | 2.8 V |
| 0000 | 1100 | 2.9 V |
| 0000 | 1101 | 3.0 V |
| 0000 | 1110 | 3.1 V |
| 0000 | 1111 | 3.2 V |
| 0001 | 0000 | >3.3 V |

The 16-bit comparator of FIG. 8 and associated bandgap reference 820 and encoder 840 are compact circuits easily integrated with Flash and other types of programmable memory without need for process modification. Hence, the addition of a voltage reference circuit and power monitor circuit enables extends the operational voltage range on a function-by-function basis for programmable memories and for the systems in which they reside in a single chip solution, without compromising the memory capacity.

The description of the embodiments set forth herein is illustrative of the invention as set forth in the following claims, and other embodiments and variations and modifications of the embodiments set forth herein may be made without departing from the scope and spirit of the invention. For example, the various component values are illustrative, and other component values may be used if desired. Moreover, although the various embodiments are most naturally useful with battery power, they may be advantageously used with any power system having a variable or fluctuating voltage component. Accordingly, the description of the embodiments set forth herein does not necessarily limit the scope of the invention as set forth in the following claims.

I claim:

1. A method of operating a memory in an application, the method comprising:

furnishing power to an integrated circuit containing the memory, the power having a variable voltage level;

establishing different first and second voltage threshold specifications for first and second functions of the application respectively;

generating on the integrated circuit an indication of the voltage level;

determining from the indication whether the voltage level is less than the first voltage threshold and whether the voltage level is less than the second voltage threshold;

suppressing the first function of the application in response to the determining step when the voltage level is less than the first voltage threshold; and suppressing the second function of the application in response to the determining step when the voltage level is less than the second voltage threshold.

2. A method as in claim 1 further comprising communicating control and data signals for the memory and the indication through a common interface on the integrated circuit.

3. A method as in claim 1 wherein the determining step is performed on the integrated circuit.

4. A method as in claim 3 further comprising communicating control and data signals for the memory and results of the determining step through a common interface on the integrated circuit.

5. A method as in claim 1 wherein the memory is a programmable non-volatile memory having a program mode and a read mode, the first application function being the memory program mode and the second application function being the memory read mode.

6. A method as in claim 1 wherein the memory is a programmable non-volatile memory, the first application function being an operating mode of the memory and the second application function being an operating mode of the application other than a memory operating mode.

7. A method as in claim 1 wherein the first and second application functions are operating modes of the application other than memory operating modes.

8. A method of operating a memory, comprising:

applying power to an integrated circuit containing the memory, the power having an applied voltage component with a variable level;

generating on the integrated circuit an indication of the level of the applied voltage, the indication being one of a plurality of different level indications; and communicating control and data signals for the memory and the voltage level indication externally of the integrated circuit through a common interface on the integrated circuit.

9. A method as in claim 8 further comprising operating the programmable memory under a heavy load condition during the voltage level indication generating step.

10. A method as in claim 8 wherein the indication generating step comprises:

generating a reference voltage;

dividing the applied voltage into a plurality of voltage intervals;

comparing the plurality of voltage intervals with the reference voltage; and generating the indication based on the voltage comparing step.

11. A method as in claim 10 wherein the step of generating the indication based on the voltage comparing step comprises encoding results of the voltage comparing step into a plurality of bits.

12. A method as in claim 10 wherein the voltage comparing step comprises:

respectively applying the plurality of voltage intervals to first inputs of a plurality of comparators; and applying the reference voltage to second inputs of the comparators, each of the comparators generating a first logical value when voltage applied to the first input thereof is greater than voltage applied to the second input thereof, and a second logical value when voltage applied to the first input thereof is less than voltage applied to the second input thereof.

13. A method of operating a memory having first and second operating modes operable above respective first and second voltage thresholds, comprising:

applying power to an integrated circuit containing the memory, the power having an applied voltage component with a variable level;

generating on the integrated circuit an indication of the level of the applied voltage, the indication being one of a plurality of different level indications;

suppressing the first operating mode in response to the indication if the level of the applied voltage is less than the first voltage threshold; and suppressing the second operating mode in response to the indication if the level of the applied voltage is less than the second voltage threshold.

14. A method as in claim 13 wherein the first and second operating mode suppressing steps are fully performed on the integrated circuit.

15. A method as in claim 13 wherein the first and second operating mode suppressing steps are performed external to the integrated circuit.

16. A method of operating a programmable non-volatile memory on an integrated circuit having a program mode operable above a program voltage threshold and a read mode operable above a read voltage threshold less than the program voltage threshold, comprising:

furnishing power to the programmable non-volatile memory, the power having a voltage level component that varies;

monitoring the voltage level;

suppressing the program mode if the voltage level is less than the program voltage threshold during the voltage level monitoring step; and suppressing the read mode if the voltage level is less than the read voltage threshold during the voltage level monitoring step.

17. A method as in claim 16 wherein the monitoring step comprises generating on the integrated circuit an indication of the voltage level, wherein the program mode suppressing step comprises:

establishing from the indication whether the voltage level is less than the program voltage threshold; and suppressing the program mode in response to the immediately aforementioned establishing step if the voltage level is less than the program voltage threshold;

and wherein the read mode suppressing step comprises:

establishing from the indication whether the voltage level is less than the read voltage threshold; and suppressing the read mode in response to the immediately aforementioned establishing step if the voltage level is less than the read voltage threshold.

18. A method as in claim 16 wherein the monitoring step comprises generating on the integrated circuit an indication of the voltage level, and wherein the program mode suppressing step and the read mode suppressing step are performed on the integrated circuit.

19. A method as in claim 16 wherein the monitoring step comprises generating on the integrated circuit an indication of the voltage level, and wherein the program mode suppressing step and the read mode suppressing step are performed external to the integrated circuit.

20. A method as in claim 16 further comprising:

furnishing the power to an application that uses the programmable non-volatile memory, the application having a function that becomes inoperative when the power is less than a function voltage threshold; and suppressing the function if the voltage level is less than the function voltage threshold during the voltage level monitoring step.

21. A method as in claim 16 wherein the voltage level monitoring step comprises monitoring the voltage level continuously during operation of the memory.

22. A method as in claim 16 wherein the voltage level monitoring step comprises monitoring the voltage level discontinuously during operation of the memory.

23. A method of operating an electronic system having a programmable non-volatile memory integrated circuit, a controller external to the memory integrated circuit, and an application that utilizes the memory integrated circuit, comprising:

furnishing power to the electronic system, the power having a variable voltage level;

operating the system;

querying the memory integrated circuit with the external controller for an indication of the voltage level at a particular moment in time during the system operation step; and generating on the memory integrated circuit an indication in response to the querying step of the voltage level at the particular moment in time during the system operation step.

24. A method as in claim 23 further comprising suppressing any function of the application having an operating voltage requirement less than the indication from the voltage level indication generating step without suppressing other functions of the application.

25. A method as in claim 23 further comprising suppressing any function of the memory integrated circuit having an operating voltage requirement less than the indication from the voltage level indication generating step without suppressing other functions of the memory integrated circuit.

26. A memory integrated circuit comprising:

a power bus;

a programmable non-volatile memory array having a read mode and a program mode with respective operating voltage requirements;

a controller having first and second ports, the first port being coupled to the programmable non-volatile memory array for selectively accessing the programmable non-volatile memory in the read mode and the program mode; and a voltage level monitor coupled to the power bus and having a voltage level output that tracks the voltage level on the power bus, the voltage level output being coupled to the second port of the controller.

27. A memory as in claim 26 wherein the controller is hardwired logic.

28. A memory as in claim 26 wherein the controller is a programmed general purpose controller.

29. A memory as in claim 26 wherein the voltage level monitor comprises:

a voltage divider coupled to the power bus, the voltage divider having a plurality of outputs;

a reference voltage generator coupled to the power bus and having an output;

a plurality of comparators respectively coupled to the outputs of the voltage divider through first inputs thereof, the comparators further having second inputs coupled to the output of the reference voltage generator and respective outputs; and an encoder having inputs coupled to the outputs of the comparators and an output, the encoder output being the voltage level output.

30. A memory as in claim 29 wherein the output of the encoder comprises a plurality of bit lines.

31. A memory as in claim 26 wherein the controller further comprises a third port for communicating memory control signals, data signals, and the voltage level output, the third port being a serial bus coupled to a pin of the integrated circuit.

32. A memory as in claim 26 wherein the controller further comprises a third port for communicating memory control signals, data signals, and the voltage level output, the third port being a parallel bus coupled to a plurality of pins of the integrated circuit.

33. A memory integrated circuit comprising:

a power bus;

a programmable non-volatile memory array;

a read voltage supply circuit coupled to the power bus and to the programmable memory array;

a program voltage supply circuit coupled to the power bus and to the programmable memory array;

a controller having a voltage level input and control outputs coupled to the read voltage supple circuit and the program voltage supply circuit;

a voltage divider coupled to the power bus, the voltage divider having a plurality of outputs;

a reference voltage generator coupled to the power bus and having an output;

a plurality of comparators respectively coupled to the outputs of the voltage divider through first inputs thereof, the comparators further having second inputs coupled to the output of the reference voltage generator and respective outputs; and an encoder having inputs coupled to the outputs of the comparators and an output coupled to the voltage level input of the controller, wherein the encoder output tracks voltage level on the power bus.

34. A memory-based application comprising:

a power bus;

a programmable non-volatile memory array having a read mode and a program mode with respective operating voltage requirements;

a first controller integrated with the programmable non-volatile memory on array an integrated circuit and having a voltage level input and inputs/outputs coupled to the programmable non-volatile memory array for selectively accessing the programmable non-volatile memory in the read mode and the program mode;

a voltage level monitor integrated with the programmable non-volatile memory array on the integrated circuit and coupled to the power bus, the voltage level monitor having a voltage level output that tracks voltage level on the power bus, the voltage level output being coupled to the voltage level input of the first controller;

a second controller coupled to the first controller; and an application circuit coupled to the power bus and to the second controller.

35. A memory-based application as in claim 34 wherein:

the first controller is coupled to the second controller through a port that conveys information on the decline in the voltage on the power bus beyond the operating voltage requirements of the program mode; and the second controller is coupled to the first controller through a port for selectively suppressing operation of the program mode and the read mode when the voltage on the power bus is less than the operating voltage requirements thereof.

36. A memory-based application as in claim 34 wherein:

the application includes a function having an operating voltage requirement;

the first controller is coupled to the second controller through a port that conveys information on the decline in the voltage on the power bus beyond the operating voltage requirement of the function of the application circuit; and the second controller is coupled to the application through a port for suppressing the function of the application circuit when the voltage on the power bus is less than the operating voltage requirement thereof.

37. A memory-based application as in claim 34 wherein:

the first controller is hardwired control logic; and the second controller is a microcontroller.

38. A memory-based application as in claim 34 wherein the first controller is coupled to the second controller through a serial bus interface.

39. A memory-based application as in claim 34 wherein the first controller is coupled to the second controller through a parallel bus interface.

40. A memory integrated circuit comprising:

a power bus;

a programmable non-volatile memory array;

a controller having a first, second and third ports, the first port being coupled to the programmable non-volatile memory array for accessing the programmable non-volatile memory; and a voltage level monitor coupled to the power bus and having a voltage level output that tracks voltage level on the power bus, the voltage level output being coupled to the second port of the controller;

the third port of the controller being an interface port for receiving voltage level indication query commands and for reporting respective indications of voltage levels on the power bus.

41. A memory integrated circuit as in claim 40 wherein the interface port conforms to a serial interface protocol.

42. A memory integrated circuit as in claim 41 wherein the serial interface protocol is SPI.

43. A memory integrated circuit as in claim 41 wherein the serial interface protocol is μWIRE.

44. A memory integrated circuit as in claim 41 wherein the serial interface protocol is I$^2$C.

45. A memory integrated circuit as in claim 41 wherein the serial interface protocol is NXS.

46. A memory as in claim 40 wherein the interface port conforms to a prallel interface protocol.

47. A memory as in claim 40 wherein the controller is a logic circuit.

48. A memory as in claim 40 wherein the controller is a programmed general purpose controller.

49. A memory as in claim 40 wherein the voltage level indications are encoded voltage values.

50. A memory as in claim 40 wherein the voltage level indications are binary values indicating whether voltage levels on the power bus have dropped below a predetermined value.

51. A memory as in claim 40 wherein the voltage level monitor comprises:

a voltage divider coupled to the power bus, the voltage divider having a plurality of outputs;

a reference voltage generator coupled to the power bus and having an output;

a plurality of comparators respectively coupled to the outputs of the voltage divider through first inputs thereof, the comparators further having second inputs coupled to the output of the reference voltage generator and respective outputs; and an encoder having inputs coupled to the outputs of the comparators and an output, the encoder output being the voltage level output.

52. A memory integrated circuit comprising:

means for receiving power having an applied voltage component with a variable level;

means for generating an indication of the level of the received voltage, the indication being one of a plurality of different level indications; and means for communicating control and data signals for the memory and the voltage level indication externally of the integrated circuit through a common interface on the integrated circuit.

53. A memory integrated circuit having first and second operating modes operable above respective first and second voltage thresholds, comprising:

means for receiving power having an applied voltage component with a variable level;

means for generating an indication of the level of the received voltage, the indication being one of a plurality of different level indications;

means for suppressing the first operating mode in response to the indication if the level of the received voltage is less than the first voltage threshold; and means for suppressing the second operating mode in response to the indication if the level of the received voltage is less than the second voltage threshold.

* * * * *